Figure 1:
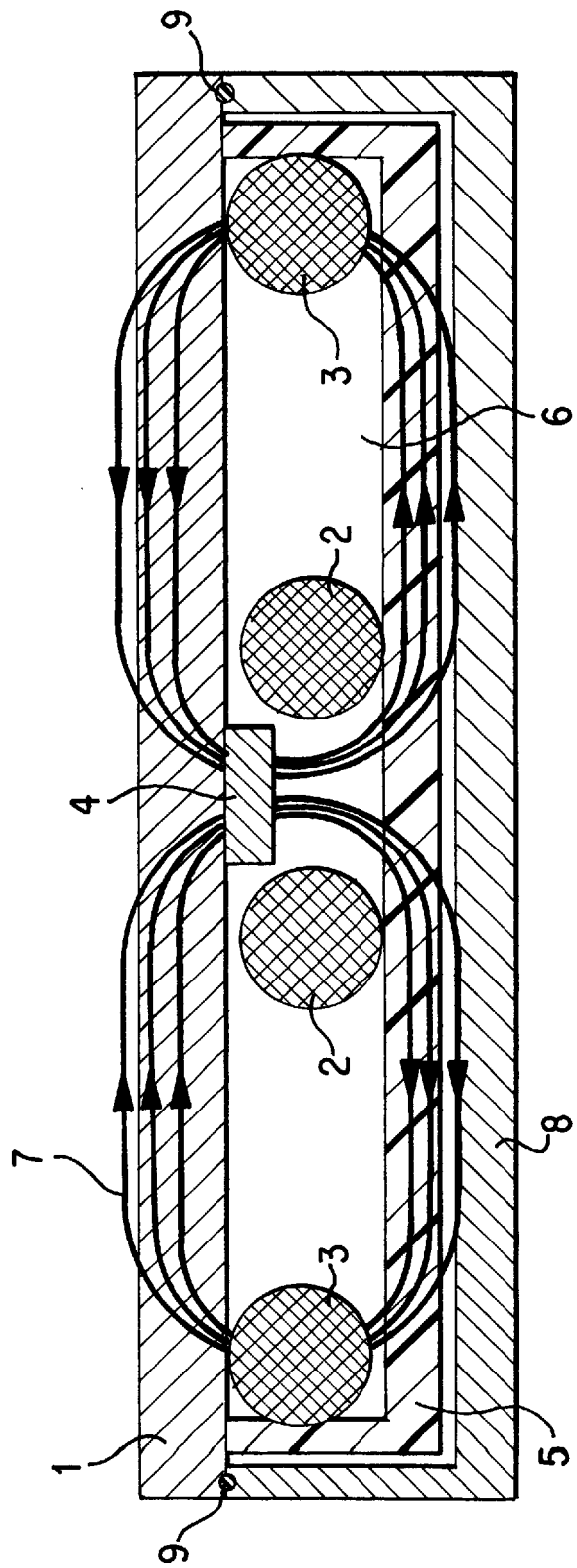

United States Patent
Curtins

Patent Number: 5,861,088
Date of Patent: Jan. 19, 1999

[54] MAGNETIC FIELD CATHODE

[75] Inventor: Herman Curtins, Grenchen, Switzerland

[73] Assignee: W. Bloesch AG, Grenchen, Switzerland

[21] Appl. No.: 428,155

[22] PCT Filed: Aug. 29, 1994

[86] PCT No.: PCT/EP94/02849

§ 371 Date: Jun. 16, 1995

§ 102(e) Date: Jun. 16, 1995

[87] PCT Pub. No.: WO95/06954

PCT Pub. Date: Mar. 9, 1995

[30] Foreign Application Priority Data

Aug. 30, 1993 [DE] Germany .......................... 43 29 155.4

[51] Int. Cl.⁶ .................................................. C23C 14/35
[52] U.S. Cl. ................................ 204/298.2; 204/298.07; 204/298.08; 204/298.19; 204/298.41
[58] Field of Search ........................ 204/192.12, 298.03, 204/298.08, 298.19, 298.2, 298.41

[56] References Cited

U.S. PATENT DOCUMENTS

| | | | |
|---|---|---|---|
| 4,401,539 | 8/1983 | Abe . | |
| 4,622,122 | 11/1986 | Landan | 204/298.19 |
| 4,724,058 | 2/1988 | Morrison, Jr. | 204/298.41 X |
| 4,810,346 | 3/1989 | Walf et al. | 204/298.19 X |
| 4,865,708 | 9/1989 | Welty . | |
| 4,891,560 | 1/1990 | Okumura . | |
| 4,964,968 | 10/1990 | Arita | 204/298.19 |
| 4,971,674 | 11/1990 | Hata | 204/298.2 X |
| 5,160,595 | 11/1992 | Hauzer et al. | 204/298.2 X |
| 5,174,875 | 12/1992 | Hurwitt et al.. | 204/298.2 X |
| 5,298,136 | 3/1994 | Ramalingam | 204/298.41 X |

FOREIGN PATENT DOCUMENTS

| | | |
|---|---|---|
| 0549 854 A1 | 7/1993 | European Pat. Off. . |
| 3735162A1 | 4/1988 | Germany . |

*Primary Examiner*—Nam Nguyen
*Assistant Examiner*—Steven H. VerSteeg
*Attorney, Agent, or Firm*—Burns, Doane, Swecker & Mathis, L.L.P.

[57] ABSTRACT

A magnetic field cathode for arc discharge vaporizers is described which has an inner ring coil associated with the target center and at least one outer ring coil associated with the peripheral region of the target, with the inwardly disposed ring coil surrounding a permanent magnet arranged at the center of the target and forming a field line concentrator together with this permanent magnet.

16 Claims, 5 Drawing Sheets

MAGNETIC FIELD CATHODE

The invention relates to a magnetic field cathode for arc discharge vaporizers having an areally formed target and an arrangement associated with the target for generating a magnetic field which holds the arc on the target surface and has at least one ring coil and a permanent magnet.

It is above all required, above all, of magnetic field cathodes for arc discharge vaporizers, which are used in arc coating technology, that they ensure a uniform target erosion, arc stability, long term stability and the avoidance of the occurrence of target contamination during operation.

The particularly critical target contamination in practice arises in the form of thicker deposits, which are indeed visible with the naked eye, on smaller or larger area regions of the target. In the event of the occurrence of such poisoned surface areas the arc which moves on the target avoids these regions, and as a consequence of this, the target contamination increases through the formation of such thicker coatings, for example of TiN or TiCN. The occurrence of such target contamination is not reproducible and impairs the constancy of the rate of deposition, the plasma stability and also the layer characteristics and bonding characteristics in a very negative manner.

An attempt has already been made to reduce these disadvantages of magnetic field cathodes for arc discharge vaporizers in that the foot of the arc is moved over the surface of the target by means of mechanically moved magnetic field configurations or by the use of time variable magnetic fields.

A mechanical movement of the magnetic field configurations however requires a considerable degree of cost and complexity which is not tolerable in practice and leaves much to be desired with respect to the results that can be achieved, in just the same way as does the use of time variable magnetic fields, since it is not possible to ensure long term constancy, uniformity of the erosion picture and adequate stability of the arc by means of these methods and above all target contaminations cannot be precluded with highly reactive processes such as the deposition of TiCN.

The object of the invention is thus to overcome the disadvantages of known magnetic field cathodes and to provide an improved magnetic field cathode which, despite a simple construction design-wise is ideally adaptable to the respective requirements in practice and which above all ensures constancy of the rate of deposition, plasma and arc stability and the avoidance of target contaminations.

This object is satisfied in accordance with the invention essentially in that an inwardly disposed ring coil associated with the center of the target and at least one outwardly disposed ring coil associated with the peripheral region of the target are provided, and in that the inwardly disposed ring coil surrounds a permanent magnet arranged at the center of the target and, together with this permanent magnet, forms a field line concentrator.

The underlying object can also be satisfied, in particular for narrow and thus also cost-favourable cathodes in that only a single ring coil surrounding the permanent magnet is associated with the permanent magnet which is arranged at the center of the target and forms a field line concentrator; and in that the length and width dimensions of the target are at least substantially matched to the region of parallel field lines extending in the target which are generated by the ring coil and the permanent magnet.

Through the layout and the cooperation of the magnet field generating components and their positioning relative to the target one succeeds, in conjunction with a suitable choice of the current strengths and polarities, in generating a magnetic field which has the respectively desired strength, that is to say, has an ideal parallel course of the field lines from the edge regions up to the center of the target and which thus ensures that the foot of the arc which forms is not held in specific target regions while forming an erosion trace by vertical magnetic field components.

One thus succeeds in providing a magnetic field cathode which takes into account the existing requirements for economy, long term process stability, arc stability, freedom from contamination effects and uniformity of the target erosion.

The ring coils which are disposed in planes at least substantially parallel to the target plane can be arranged beneath the target in a common plane, however it is also possible to position the ring coils in mutually displaced parallel planes and also to arrange the ring coils so that they are adjustable relative to the target plane and/or relative to one another, since in this way the course of the magnetic field can be influenced in the region of the target surface and, through the corresponding coil positioning, the formation of undesired vertical magnetic field components can be prevented and their presence in the centre and edge regions of the target can be minimized in relation to the target surface.

The permanent magnet which, together with the inwardly disposed coil, forms the centrally disposed field line concentrator, consists of a ferrite, samarium cobalt, of neodymium-iron-boron, iron-chromium-cobalt or aluminium-nickel-cobalt, whereby it is possible to minimized the spatial dimensions of the permanent magnet so that a very compact arrangement of a permanent magnet and an inner ring coil is obtained at the centre of the cathode which in turn ensures that the target surface can be ideally exploited.

In the case of the preferred use of two ring coils, namely an inner ring coil and an outer ring coil, these coils are preferably built up in similar manner and wound from copper wire, however this does not represent a necessity, since the magnetic fields which are to be generated with field lines extending parallel to the target surface can also be obtained when, for example, the number of turns and/or conductor cross-sections are chosen to be different. It is also possible to execute the ring coils in the form of a single conductor turn whereby a particularly small volume construction is obtained, since in this case the air interspaces between the individual windings of a wound coil are avoided.

It is also important that each of the two ring coils can be differentially energised with current for which purpose an individual current source is preferably associated with each coil. Thus each coil can be energised in such a way that, by suitable choice of the current strengths and polarities, the respectively desired ideal overall configuration of the magnetic field is generated, and indeed while taking account of the prevailing practical circumstances, such as for example the target thickness.

When taking account of the magnetic fields that have been set attention should always be paid to the fact that the arc current is to be selected such that, for the purpose of achieving an ideal erosion picture and for the purpose of avoiding target contaminations, the traces which result on the target surface of the arc, which moves in a predeterminable direction of rotation, continually alternate between branched main and side branches, with side branches becoming main branches and vice versa in the course of this movement of the arc foot.

In this connection it is of important significance in the context of the invention that the arc voltage or the magnetic field strength can be preset in a defined manner, with a characteristic magnetic field strength preferably being associated with each layer type.

A further special feature of the invention lies in the fact that a readjustment of the magnetic field strength generated by the ring coils takes place in dependence on the respective target erosion, with a readjustment in particular then being effected when a specific arc voltage rise occurs, which can also be preset in dependence on the layer type.

In accordance with the invention a recess for receiving the permanent magnet can be provided at the lower side of the target, which is of advantage, particularly when using thicker targets. This recess of the lower side of the target is located in the non-eroded central region of the target and thus does not impair the exploitation of the target. On the contrary, as a result of the symmetry of the permanent magnet to the target surface, a positive target exploitation effect arises, particularly with thicker targets.

When, in accordance with a further embodiment of the invention, the outer lying ring coil is not arranged beneath but rather laterally outside of the target then in this manner the target exploitation can be further improved because the erosion region can extend directly up to the actual target edge.

It is also possible to operate the magnetic field cathode in accordance with the invention in the manner of an imbalanced magnetron and in this case at least one further magnetic coil is provided which surrounds the magnetic field cathode and its associated ring coils and is so operated that a magnetic field arises which promotes the propagation of the plasma in the space in front of the cathode. By matching of the inner and outer ring magnet coils provided in accordance with the invention it can also be ensured with this layout that in the are a of the target a magnetic field course parallel to its surface is guaranteed.

Further particularly advantageous layouts and features of the invention are set forth in the subordinate claims.

Figure 2:
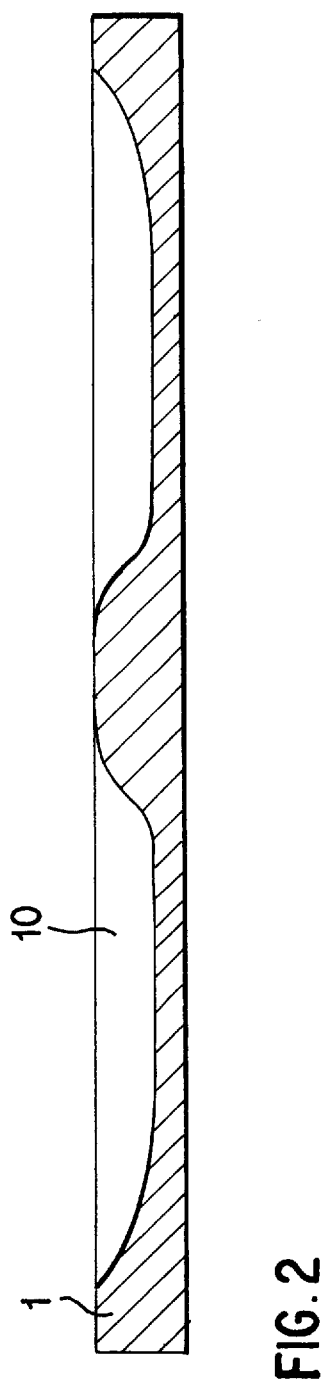
Figure 3:
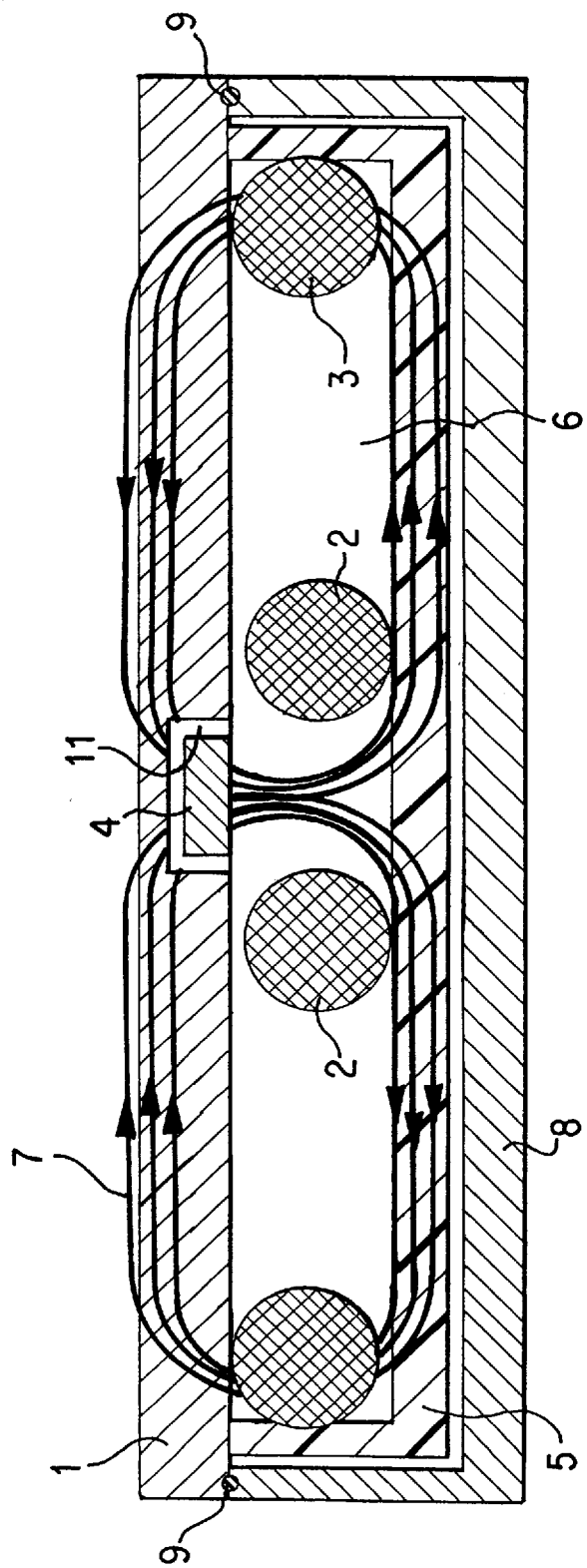
Figure 4:
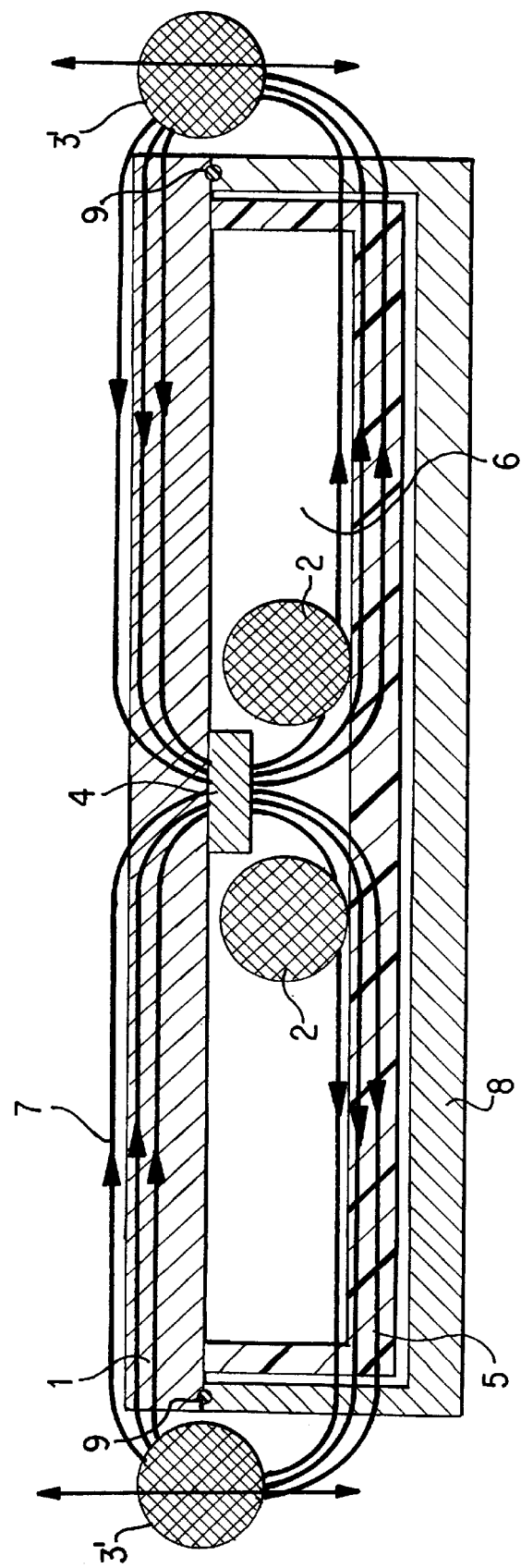
Figure 5:
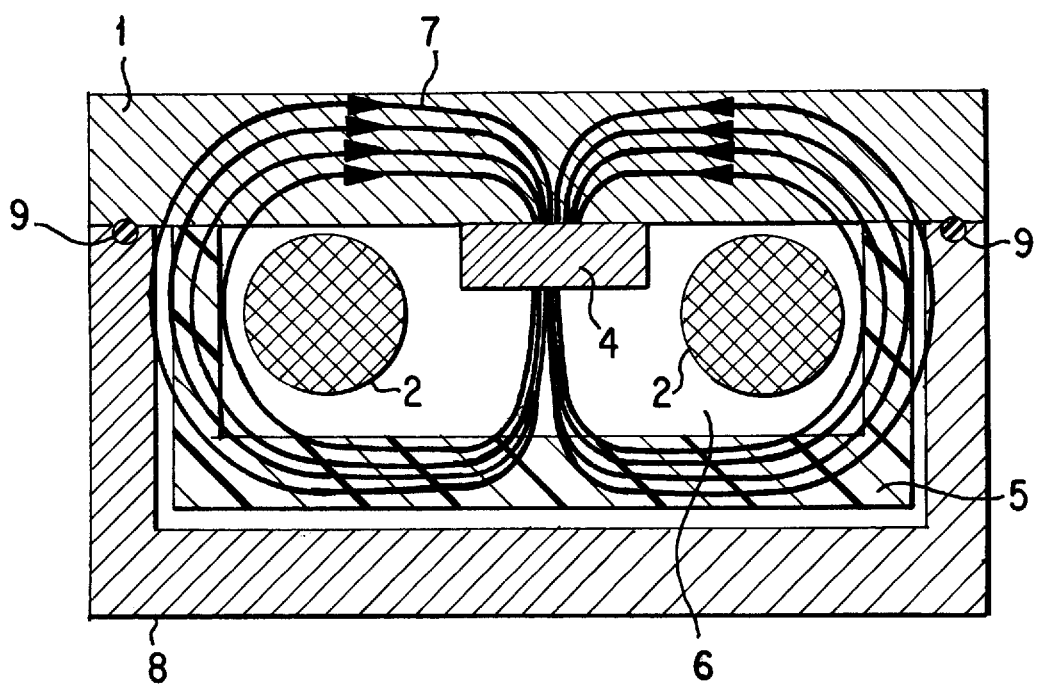

Embodiments of the invention will now be described in the following with reference to the drawings in which are shown:

FIG. 1 a schematic illustration of the build-up of the magnet field cathode in accordance with the invention, FIG. 2 a typical erosion picture of a target of the magnetic field cathode of FIG. 1, FIG. 3 a schematic illustration of an embodiment of the magnetic field cathode of FIG. 1 with the permanent magnet integrated into the target, FIG. 4 a schematic illustration of a further variant of a magnetic field cathode in accordance with the invention, and FIG. 5 a schematic illustration of a further variant of a magnetic field cathode of the invention which is suitable for narrow cathodes.

FIG. 1 shows a target 1 which can for example be a titanium target which has the shape of an elongated rectangle in plan view.

Associated with this target 1 is a magnetic field generating arrangement comprising an inwardly disposed coil 2, an outwardly disposed coil 3 and a centrally arranged permanent magnet 4.

The two coils 2, 3 are matched in shape to the shape of the target and extend substantially over the entire length of the target, with a reception area for the permanent magnet 4 being provided between the two limbs of the inner coil 2 which extend in the longitudinal direction of the target.

The permanent magnet 4 is of bar shape and is made as narrow as possible so that the inner coil 2 and the permanent magnet 4 can be arranged as close to one another as possible in the centre region of the target 1.

Magnetic materials which are suitable for generating a strong magnetic field with a small volume are preferably used for the permanent magnet and preferably magnets of ferrite, somarium cobalt, neodymium-iron-boron, iron-chromium-cobalt or aluminium-nickel-cobalt are suitable for this purpose.

The two coils 2, 3 and the permanent magnet 4 are arranged in a housing 5 which preferably consists of plastic material and is of flat trough-like shape. The inner space 6 of this housing 5 simultaneously forms a coolant space, that is to say coolant can be conducted through the housing 5 the cover wall of which is formed by the target 1.

The plastic housing 5 which accommodates the two coils 2, 3 is located within a metallic trough 8, for example consisting of copper, stainless steel and the like which is open at the cover side and serves as a target carrier. A vacuum seal 9 is provided between the metallic trough 8 and the target 1.

FIG. 2 shows a typical erosion picture such as can be obtained when using a magnetic field cathode in accordance with FIG. 1. This erosion picture makes it clear that the erosion region 10 between the central region of the target and the edge region of the target extends in a pronouncedly uniform manner, that is to say, a very good target exploitation is present.

The embodiment of FIG. 3 is distinguished from the embodiment of a magnetic field cathode of FIG. 1 in that a recess 11 is provided at the lower side of the target 1 in its central region for receiving the permanent magnet 4. This recess 11 can be so shaped that the permanent magnet 4 is held with little clearance or in form-locked manner in the recess 11, and the permanent magnet 4 can be wholly or partly received in this recess 11.

This embodiment is suitable above all for thicker targets 1 in which, on the one hand, the parallel course of the magnetic field lines 7 up to and into the centre of the target is promoted for these thicker targets also and, on the other hand, precisely that target region is used which is not eroded in practice—as shown in FIG. 2.

The embodiment of FIG. 4 makes it clear that the outwardly disposed ring coil 3' can also be arranged outside of the target 1 and that the inwardly disposed ring coil 2, in just the same way as the outwardly disposed ring coil 3', can be adjusted relative to one another and also relative to the target 1. That is to say that, by presetting the position of the planes determined by the ring coils 2 and 3 relative to one another and relative to the target plane, the magnetic fields which are generated can be so preset and influenced that, in cooperation with the permanent magnet 4, a parallel run of the magnetic field lines 7 can be achieved over the entire target surface, and indeed with the most diverse types of target and also during the wearing down of the target which arises in operation.

The possibility of adjusting the inner coil 2 and of the outer coil 3' is characterised in FIG. 4 by double arrows.

In order to ensure the best possible flux transition between the outwardly disposed ring coil 3' and the target 1 a coupling in of this outwardly disposed ring coil 3' can, if necessary take place via a soft iron layer.

It can also be clearly found from FIG. 4 that an advantageous extension of the erosion area of the target 1 up to its edge is made possible by means of a ring coil 3' lying outside of the target 1, which represents a further improvement relative to the erosion picture shown in FIG. 2.

Naturally, with the magnetic field cathode of FIG. 4, the permanent magnet 4 can also be wholly or partly received in a target recess in analogy to the embodiment of FIG. 3.

By suitable choice of the current strengths in the two coils 2, 3 one succeeds, in conjunction with the special positioning of the compactly designed and specially positioned permanent magnet 4, in generating a magnetic field which has the desired strength matched to the particular layer type, with field lines which extend parallel to almost the whole target surface, and indeed both with thick targets and also with thin targets, that is to say also with an advanced level of erosion.

FIG. 5 shows an embodiment of the invention which is particularly intended for narrow cathodes and is of particularly priceworthy design. In this arrangement the magnetic field generating arrangement comprises a single coil 2 which is arranged adjacent to the centrally arranged permanent magnet 4 and surrounds the latter. Through the cooperation of the coil 2 and of the permanent magnet 4, which again forms a magnetic field concentrator, parallel field lines 7 are generated in the target 1 and having an areal extent which at least substantially determines the target dimensions. In this manner it is ensured, even with such small and price-favourable targets, that all the advantages explained in connection with the above embodiments are obtained, with the modifications described in connection with the embodiments with an inwardly disposed and an outwardly disposed coil also being usable in an analogous manner with this narrow target.

Through the magnetic field concentration which is obtained it is ensured, in conjunction with the selected arc current strength, that the foot of the arc is always moving and does not etch its way into any particular region of the target and lead to disturbing erosion tracks or to the undesired formation of larger droplets which could be ejected and would substantially deteriorate the layer quality.

Through the layout of the target in accordance with the invention it is not only possible to ensure a surprisingly good parallelism of the magnetic field which extends substantially over the entire target surface, but rather it is also possible to flexibly set the strength of the magnetic field flexibly, and indeed over the entire working life of the target.

For example, a device is provided for readjustment of the magnetic field strength generated by the ring coils (2, 3) in dependence on the target erosion and that the time point of a readjustment is in particular selected in dependence on a predeterminable arc voltage rise having been exceeded, and preferably on an arc voltage rise in the range of about 0.3 V to 0.5 V having been exceeded.

The advantages which result from the layout and function of the magnetic field cathode in accordance with the invention are above all:

that an ideal and uniform erosion, and thus the best possible exploitation of the respective target, can be ensured, that in dependence on the particular kind of hard material layer, for example TiN, TiCN or CrN and the like, a flexible adjustment of the respective magnetic field strength can take place, that as a result of the constant parallel magnetic field which is provided contamination of the target can be precluded and thereby a constant quality can be ensured over the entire working life of the target, and as a consequence of this also a long term process stability, that by precluding target contamination the possibility of the sequential deposition of titanium based materials is in particular also provided, and that as a result of the simple layout practically no servicing costs arise, and thus a high degree of economy is present, which also comes to expression through the fact that a very high number of charges can be coated by means of a single target, for example up to 500 charges with a target having a thickness of approximately 25 mm.

I claim:

1. A magnetic field cathode for use with arc discharge vaporizers which generate an arc, comprising a target having an upper surface, a lower surface, a peripheral region, and a center region, a magnetic field generating device adjacent said target for holding said arc on said target upper surface, and a magnetic field line concentrator adjacent said target which, when said magnetic field generating device generates a magnetic field having magnetic field lines, concentrates a portion of said magnetic field lines to run substantially parallel adjacent a portion of said target upper surface, said magnetic field line concentrator comprising an inner ring coil adjacent said target center region, an outer ring coil adjacent said target peripheral region, and a permanent magnet arranged at substantially said target center region, wherein said inner coil surrounds said permanent magnet, and said inner and outer ring coils are substantially arranged in a plane which is disposed beneath said target lower surface and which extends substantially parallel with said target upper surface, and further comprising means for readjustment of the magnetic field strength generated by said inner and outer ring coils in dependence on erosion of said target, said readjustment means adjusting said magnetic field strength when a predetermined arc voltage rise from about 0.3 V to about 0.5 V has been exceeded.

2. A magnetic field cathode in accordance with claim 1, wherein the position of at least one of said inner and outer ring coils is adjustable relative to said target upper surface.

3. A magnetic field cathode in accordance with claim 1, wherein the positions of said ring coils are adjustable relative to one another perpendicular to said target upper surface.

4. A magnetic field cathode in accordance claim 1, wherein said inner ring coil surrounds said permanent magnet on all sides with a small spacing.

5. A magnetic field cathode in accordance with claim 1, wherein said outer ring coil is arranged beneath said peripheral region of said target.

6. A magnetic field cathode in accordance with claim 1, wherein said permanent magnet is arranged adjacent said target lower surface, and said permanent magnet has a dimension transverse and small relative to said target lower surface.

7. A magnetic field cathode in accordance with claim 1, further comprising a recess in said target lower surface, and wherein said permanent magnet is arranged in said recess.

8. A magnetic field cathode in accordance with claim 1, wherein said permanent magnet comprises a material selected from the group consisting of ferrite, samarium cobalt, neodymium-iron-boron, iron-chromium-cobalt, and aluminum-nickel-cobalt.

9. A magnetic field cathode in accordance with claim 1, wherein said permanent magnet has a cross-sectional area in a plane perpendicular to said target upper surface, and said inner coil ring has a cross-sectional area, wherein said permanent magnet cross-sectional area is smaller than said inner ring coil cross-sectional area.

10. A magnetic field cathode in accordance with claim 1, wherein said target is formed in the shape of an elongated rectangle, and said peripheral region has a peripheral region contour, said inner and outer ring coils extend substantially along said peripheral region contour separated by a ring coil separation distance, and wherein said permanent magnet is of bar-shape, a transverse dimension of said permanent magnet corresponding substantially to said ring coil separation distance.

11. A magnetic field cathode in accordance with claim 1, wherein said inner and outer ring coils are constructed of substantially the same shape and material.

12. A magnetic field cathode in accordance with claim 1, further comprising an individual power source associated with each of said inner and outer ring coils, whereby the magnetic field strengths of said inner and outer ring coils are independently adjustable.

13. A magnetic field cathode in accordance with claim 1, further comprising a common carrier housing, one of said housing and said target further comprising a cover wall extending between said target and said housing to form a trough shape with said housing for conducting coolant through said trough, wherein said inner and outer ring coils and said permanent magnet are arranged in said trough.

14. A magnetic field cathode in accordance with claim 13, further comprising a metallic trough, and wherein said housing comprises a plastic material and is arranged in said metallic trough, said metallic trough sealingly contacting said target lower surface in said peripheral region.

15. A magnetic field cathode in accordance with claim 1, further comprising an arc generator which generates an arc including an arc foot which impinges on said target upper surface and creates traces therein when rotating on said target upper surface, said arc generator being adjustable to select the arc current so that said traces resulting on said target upper surface by said arc foot, as seen in the direction of said rotation of said arc foot, change between branching main traces and side traces to side traces becoming main traces and main traces becoming side traces.

16. A magnetic field cathode for use with arc discharge vaporizers which generate an arc, comprising a target having an upper surface, a lower surface, a center region, and a length and a width, a magnetic field generating device adjacent said target for holding said arc on said target upper surface, and a magnetic field line concentrator adjacent said target which, when said magnetic field generating device generates a magnetic field having magnetic field lines, concentrates a portion of said magnetic field lines to run substantially parallel adjacent a portion of said target upper surface, said magnetic field line concentrator comprising a single inner ring coil adjacent said target center region, and a permanent magnet arranged at substantially said target center region, wherein said single inner ring coil surrounds said permanent magnet, said single inner ring coil and said permanent magnet generating a region of parallel field lines extending in said target when current flows through said single inner ring coil, said single inner ring coil substantially arranged in a plane which is disposed beneath said target lower surface and which extends substantially parallel with said target upper surface, said target length and width are substantially matched to said region of parallel field lines.

* * * * *